United States Patent
Ho et al.

(10) Patent No.: US 12,507,495 B2
(45) Date of Patent: Dec. 23, 2025

(54) IMAGE SENSOR PACKAGE WITH LOW LIGHT-SENSING NOISE

(71) Applicant: Powertech Technology Inc., Hukou Township (TW)

(72) Inventors: Wei-Lun Ho, Hukou Township (TW); Chia-Ling Lee, Hukou Township (TW)

(73) Assignee: Powertech Technology Inc., Hukou Township (TW)

( * ) Notice: Subject to any disclaimer, the term of this patent is extended or adjusted under 35 U.S.C. 154(b) by 431 days.

(21) Appl. No.: 18/092,542

(22) Filed: Jan. 3, 2023

(65) Prior Publication Data
US 2024/0021637 A1  Jan. 18, 2024

(30) Foreign Application Priority Data
Jul. 15, 2022  (TW) .................. 111126746

(51) Int. Cl.
*H10F 39/00*  (2025.01)

(52) U.S. Cl.
CPC ..... *H10F 39/8057* (2025.01); *H10F 39/8053* (2025.01); *H10F 39/811* (2025.01)

(58) Field of Classification Search
CPC ............. H10F 39/8057; H10F 39/8053; H10F 39/811; H10F 39/804
See application file for complete search history.

(56) References Cited

U.S. PATENT DOCUMENTS

| | | | |
|---|---|---|---|
| 6,376,872 B1 * | 4/2002 | Pai | H10F 39/182 257/292 |
| 2003/0025442 A1 * | 2/2003 | Takeuchi | H04N 9/12 348/E9.012 |
| 2011/0124824 A1 * | 5/2011 | Nagata | C08F 2/44 525/451 |
| 2013/0044384 A1 * | 2/2013 | Kim | G06F 3/0412 156/60 |
| 2018/0138225 A1 * | 5/2018 | Kim | H10F 39/182 |

(Continued)

FOREIGN PATENT DOCUMENTS

| | | | | |
|---|---|---|---|---|
| CN | 1700068 A | * | 11/2005 | ....... G02F 1/133553 |
| CN | 102652284 A | * | 8/2012 | ......... G02B 13/0085 |

(Continued)

*Primary Examiner* — Mohammed Shamsuzzaman
(74) *Attorney, Agent, or Firm* — patenttm.us

(57) ABSTRACT

An image sensor package with low light-sensing noise has a chip body having a photosensitive area and non-sensitive area. The photosensitive area includes a photosensitive layer having a plurality of photosensitive units. A color filter is disposed on the photosensitive layer and has a plurality of filter units corresponding to the photosensitive units and a black matrix. A black adhesive layer is disposed on the non-sensitive area for mounting a glass cover. A gap is kept between the glass cover and the first surface of the chip body. When an incident light passes through the glass cover and emits to the photosensitive area, the black matrix absorbs the light traveling through the filter unit toward the photosensitive units adjacent to the filter unit. Furthermore, a light emitting to the non-sensitive area can be absorbed by the black adhesive layer. Thus, a light-sensing noise of the chip can be effectively decreased.

20 Claims, 8 Drawing Sheets

(56) References Cited

U.S. PATENT DOCUMENTS

| | | | | |
|---|---|---|---|---|
| 2019/0148429 | A1* | 5/2019 | Wang | H04N 23/55 |
| | | | | 348/294 |
| 2021/0202630 | A1* | 7/2021 | Jeon | H10K 50/844 |
| 2022/0130935 | A1* | 4/2022 | Kim | H10K 50/865 |
| 2022/0155504 | A1* | 5/2022 | Hsieh | G02B 1/002 |
| 2022/0352132 | A1* | 11/2022 | Seo | H10D 86/021 |
| 2023/0030963 | A1* | 2/2023 | Yamamoto | H04N 23/55 |
| 2025/0040276 | A1* | 1/2025 | Hsu | H10F 39/811 |

FOREIGN PATENT DOCUMENTS

| | | | | | |
|---|---|---|---|---|---|
| CN | 104078479 | A | * | 10/2014 | G06F 3/0412 |
| CN | 106030471 | A | * | 10/2016 | G06F 3/0412 |
| CN | 108364970 | A | * | 8/2018 | H01L 27/14601 |
| CN | 111799298 | A | * | 10/2020 | H10K 59/131 |
| CN | 113661417 | A | * | 11/2021 | C08K 3/28 |
| CN | 116264628 | A | * | 6/2023 | G06F 3/0412 |
| EP | 2640040 | A1 | * | 9/2013 | G02B 6/003 |
| EP | 3869562 | A1 | * | 8/2021 | H01L 27/14618 |
| EP | 4425547 | A1 | * | 9/2024 | H01L 21/3205 |
| JP | 2004103519 | A | * | 4/2004 | G02B 13/0085 |
| JP | 2008091037 | A | * | 4/2008 | G06F 3/0412 |
| TW | 201711148 | A | * | 3/2017 | H01L 21/56 |
| TW | 201727880 | A | | 8/2017 | |
| TW | 202220198 | A | * | 5/2022 | H01L 27/14605 |
| WO | WO-2018149360 | A1 | * | 8/2018 | H01L 27/146 |
| WO | WO-2020059382 | A1 | * | 3/2020 | F21S 41/43 |
| WO | WO-2020062140 | A1 | * | 4/2020 | G06K 9/0004 |

* cited by examiner

IMAGE SENSOR PACKAGE WITH LOW LIGHT-SENSING NOISE

CROSS-REFERENCE TO RELATED APPLICATIONS

This application is based upon and claims priority under 35 U.S.C. 119 from Taiwan Patent Application No. 111126746 filed on Jul. 15, 2022, which is hereby specifically incorporated herein by this reference thereto.

BACKGROUND OF THE INVENTION

1. Field of the Invention

The present invention is related to a semiconductor package, and more particularly to an image sensor package with low light-sensing noise efficiently eliminating the ghost image and reducing the flare.

2. Description of the Prior Arts

With reference to FIG. 7, an image sensor package in accordance with the prior art has an image sensor chip 50, a color filter 60, an adhesive layer 70 and a glass cover 80. The image sensor chip 50 includes a chip body 51 and a photosensitive layer 52. The chip body 51 has a first surface 511 including a photosensitive area 512 and a non-sensitive area 513, and the non-sensitive area 513 surrounds the photosensitive area 512. The photosensitive area 512 includes the photosensitive layer 52 having a plurality of photosensitive units 521 arranged in a matrix. The color filter 60 is disposed on the photosensitive layer 52 and has a plurality of filter units 61 arranged in a matrix. The filter units 61 respectively correspond to the photosensitive units 521 of the photosensitive layer 52. The glass cover 80 is mounted on the image sensor chip 50 through the adhesive layer 70.

When an incident light L4 emits to the photosensitive area 512 through the glass cover 80, the incident light L4 passes through one of the filter units 61a and is sensed by the photosensitive unit 521 formed under the filter unit 61a. However, due to the filter unit 61 and the photosensitive units 521 are arranged in a matrix, and the incident angle of the incident light L4, the incident light L4 also passes through another filter unit 61b adjacent to the filter unit 61a. Then, the incident light L4 is sensed by a photosensitive unit 521a formed under the filter unit 61b. A ghost image is formed because of the incident light L4 sensed by the photosensitive unit 521a. Furthermore, due to the adhesive layer 70 is transparent and has a high reflectivity, when the glass cover 80 is mounted on the image sensor chip 50 through the adhesive layer 70, a glue of the adhesive layer 70 easily overflows and forms a rough inner wall. Thus, when another incident light L5 emits to the non-sensitive area 513, the incident light L5 could be diffusively reflected to the photosensitive layer 52 by the inner wall of the adhesive layer 70. Then, the reflected incident light L5 is directly sensed by the photosensitive units 521 and causes a flare. The aforementioned ghost image and the flare are light-sensing noises which influences an image quality of the image sensor package. Therefore, the image sensor package in accordance with the prior art have to be improved.

SUMMARY OF THE INVENTION

An objective of the present invention is to provide an image sensor package with low light-sensing noise.

To achieve the objection as mentioned above, the image sensor package includes:
an image sensor chip having:
  a chip body having a first surface and a second surface, wherein the first surface has a photosensitive area and a non-sensitive area, and the non-sensitive area surroundings the photosensitive area;
  a photosensitive layer formed on the photosensitive area of the chip body and having a plurality of photosensitive units arranged in a matrix;
  a first wiring layer formed on the non-sensitive area of the chip body;
  a second wiring layer formed on the second surface of the chip body; and
  a plurality of conductive vias formed through the chip body to electrically connect to the first wiring layer on the first surface and the second wiring layer on the second surface;
a color filter disposed on the photosensitive layer of the image sensor chip and having:
  a plurality of filter units arranged in a matrix; and
  a black matrix formed among the filter units, wherein the filter units respectively correspond to the photosensitive units of the photosensitive layer;
a black adhesive layer disposed on and partially covering the first wiring layer of the image sensor chip; and
a glass cover mounted on the first surface of the chip body through the black adhesive layer, wherein a gap is kept between the glass cover and the first surface of the chip body.

With the foregoing description, the present invention mainly forms the black matrix among the filter units of the color filter and disposes the black adhesive layer on the non-sensitive area. When an incident light passes the glass cover and emits to the photosensitive area of the chip body, the incident light passing through one of the filter units and traveling to one of the photosensitive units adjacent to the filter unit is absorbed by the black matrix. Therefore, the black matrix drastically reduces the light-sensing noise of the chip body and prevents the image sensor package from forming a ghost image. Furthermore, the incident light passing through the glass cover and emitting to the non-sensitive area is directly absorbed by the black adhesive layer. In other words, the black adhesive layer does not reflect the incident light. Therefore, the black adhesive layer reduces the chance in forming flare.

DETAILED DESCRIPTION OF THE EMBODIMENTS

With multiple embodiments and drawings thereof, the features of the present invention are described in detail as follows.

Figure 1:
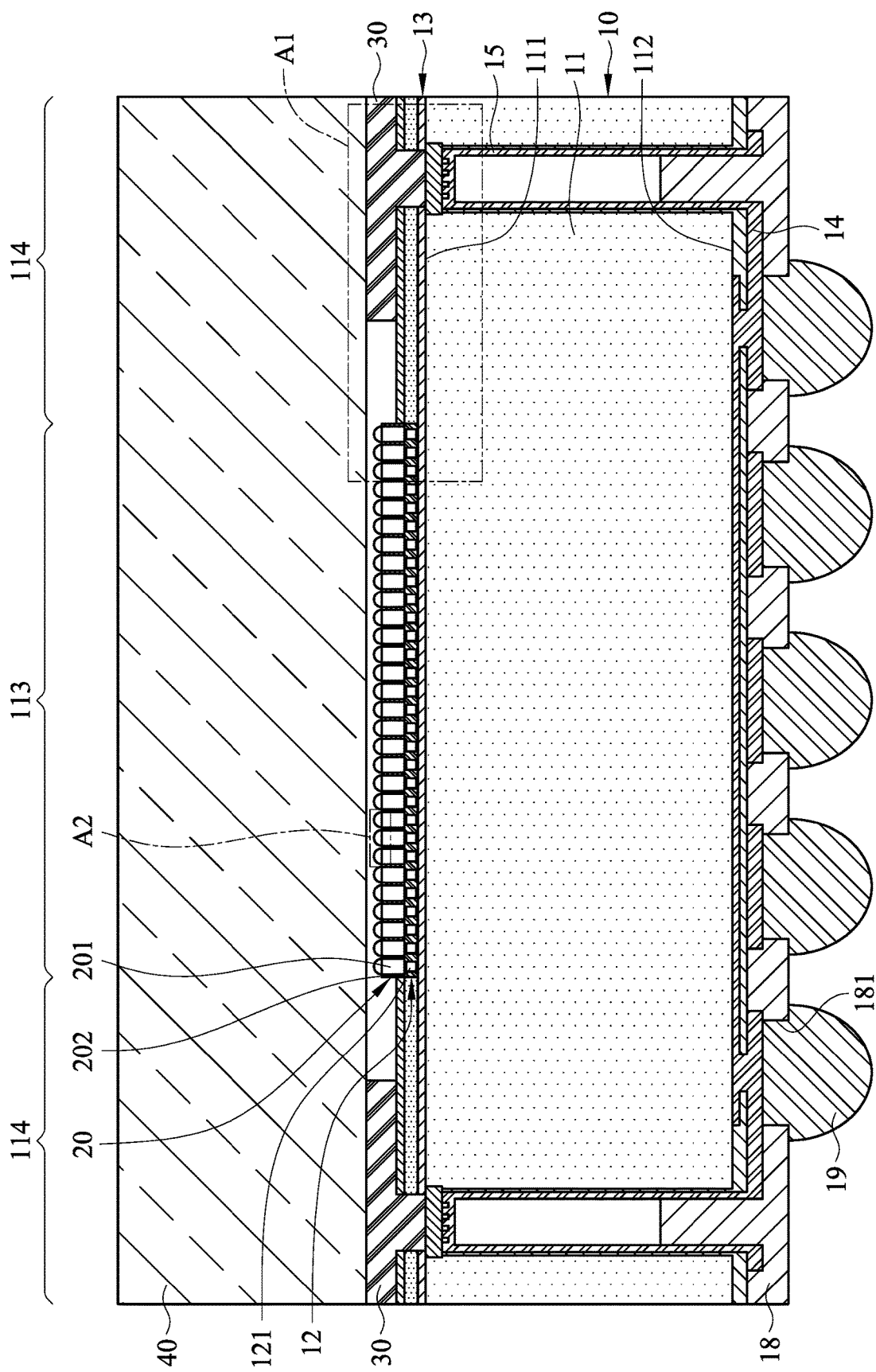
FIG. 1 is a side view in partial section of a first embodiment in accordance with the present invention.

With reference to FIG. 1, a first embodiment of an image sensor package with low light-sensing noise is shown, the image sensor package has an image sensor chip 10, a color filter 20, a black adhesive layer 30 and a glass cover 40.

The image sensor chip 10 has a chip body 11, a photosensitive layer 12, a first wiring layer 13, a second wiring layer 14 and a plurality of conductive vias 15. The chip body 11 has a first surface 111 and a second surface 112 opposite to each other. The first surface 111 has a photosensitive area 113 and a non-sensitive area 114, and the non-sensitive area 114 surrounds the photosensitive area 113. The photosensitive layer 12 is formed on the photosensitive area 113 of the chip body 11 and has a plurality of photosensitive units 121 arranged in a matrix. The first wiring layer 13 is formed on the non-sensitive area 114, and around the photosensitive layer 12 to electrically connect to the photosensitive units 121 of the photosensitive layer 12. In one embodiment, the first wiring layer 13 may have a dielectric layer with low dielectric coefficient and a passivation layer 131 formed on the first wiring layer 13. The second wiring layer 14 is formed on the second surface 112 of the chip body 11. The conductive vias 15 correspond to the non-sensitive area 114 of the first surface 111 and is formed through the first surface 111 and the second surface 112 of the chip body 11. The conductive vias 15 electrically connect to the first wiring layer 13 formed on the first surface 111 and the second wiring layer 14 formed on the second surface 112.

In the present embodiment, the image sensor chip 10 further has a plurality of metal pads 16 and a plurality of holes 17. The metal pads 16 are formed on the non-sensitive area 114 of the first surface 111 of the chip body 11. In the present embodiment, the metal pads 16 are embedded into the first surface 111 of the chip body 11 and has a top surface and a bottom surface. The bottom surface of each of the metal pads 16 contacts the corresponding conductive via 15. The top surface of each of the metal pads 16 contacts the first wiring layer 13. The metal pads 16 electrically connect to the first wiring layer 13 and the conductive vias 15. Therefore, the conductive vias 15 and the metal pads 16 corresponding to the conductive vias 15 are used for transmitting the signals sensed by the photosensitive units 121 of the photosensitive layer 12. The holes 17 correspond to the metal pads 16 and are formed through the first wiring layer 13 to respectively expose the metal pads 16.

In the present embodiment, as shown in FIG. 1, the image sensor chip 10 further has a solder mask 18 and a plurality of solder balls 19. The solder mask 18 is formed on the second wiring layer 14 of the image sensor chip 10. The solder mask 18 has a plurality of openings 181 to expose a part of the second wiring layer 14. The solder balls 19 are respectively formed on the corresponding openings 181 of the solder mask 18 and electrically connect to the exposed part of the second wiring layer 14. In the present embodiment, the solder mask 18 is further partially filled in the conductive vias 15. In one embodiment, the solder mask 18 may be completely filled in the conductive vias 15, but is not limited thereto.

With reference to the FIGS. 1, 2, 3A and 3B, the color filter 20 is disposed on the photosensitive layer 12 of the image sensor chip 10 and has a plurality of filter units 201, a black matrix 202 and a plurality of micro-condenser lenses 203. The filter units 201 are arranged in a matrix. The black matrix 202 is formed among the filter units 201. The micro-condenser lenses 203 are respectively disposed on the filter units 201.

The filter units 201 of the color filter 20 are columnar and respectively correspond to the photosensitive units 121 of the photosensitive layer 12. In the present embodiment, the filter unit 201 is a red filter unit 201R, a green filter unit 201G and a blue filter unit 201B in order from the left to the right. In another embodiment, the arrangement of the filter units 201 can be the Bayer filter, but is not limited thereto.

Figure 3A:
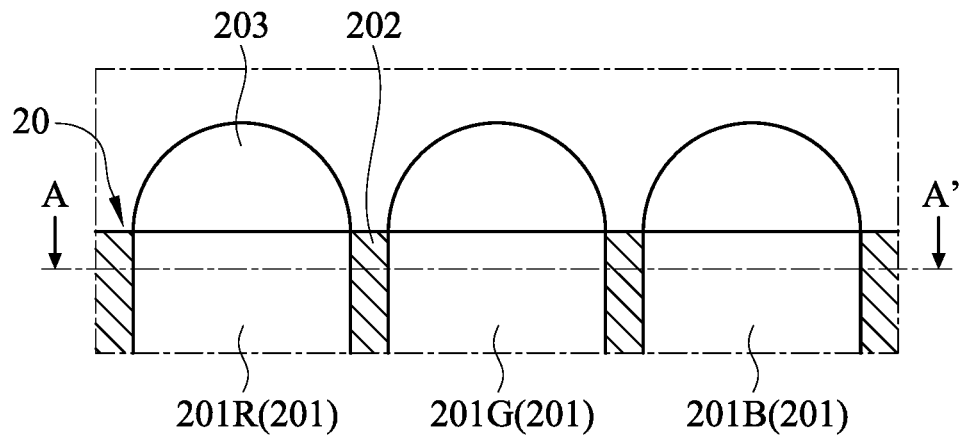
FIG. 3A is an enlarged view of a part of the A2 area in FIG. 1.
Figure 3B:
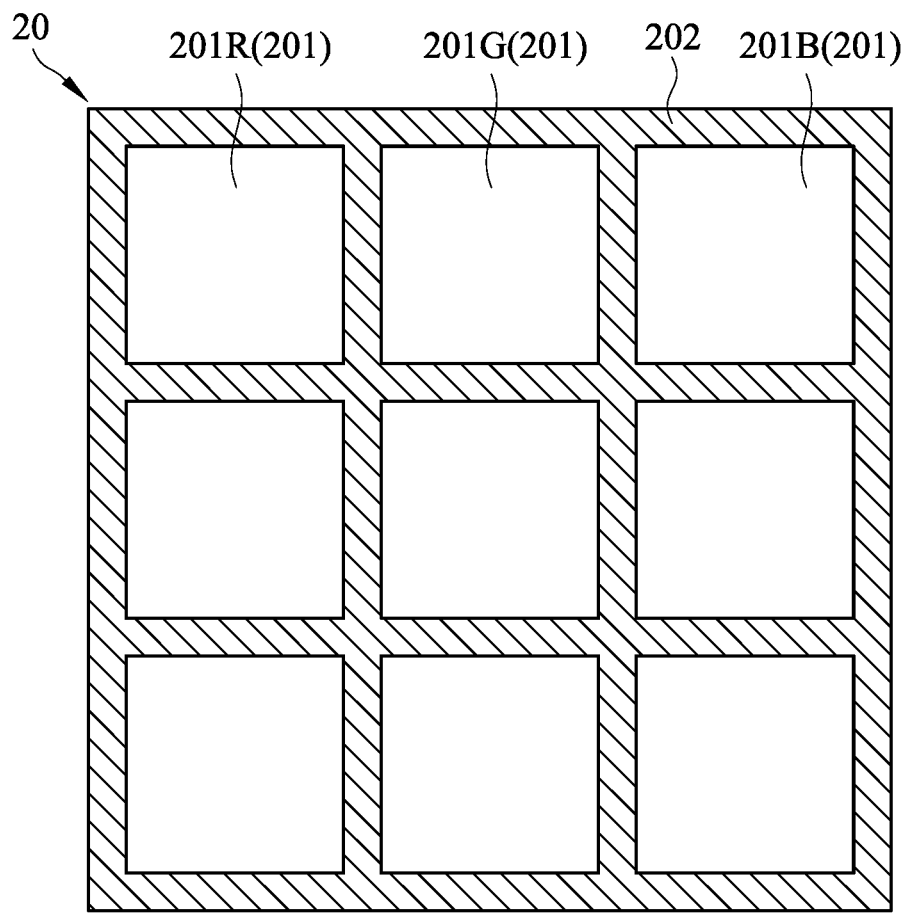
FIG. 3B is a cross-sectional view along A-A' line in FIG. 3A.
Figure 4A:
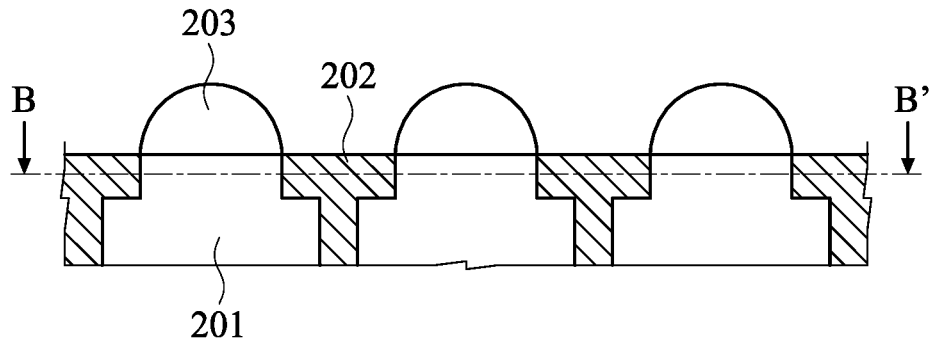
FIG. 4A is an enlarged side view in partial section of a part of a second embodiment in accordance with the present invention.
Figure 4B:
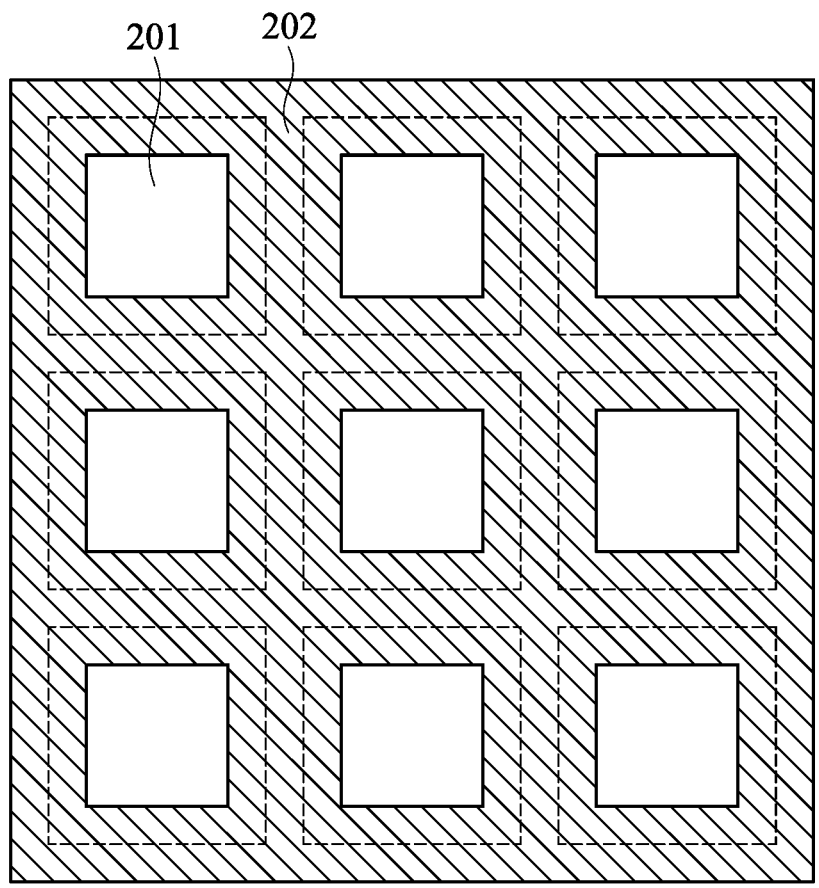
FIG. 4B is a cross-sectional view along with the B-B' line in FIG. 4A.
Figure 5A:
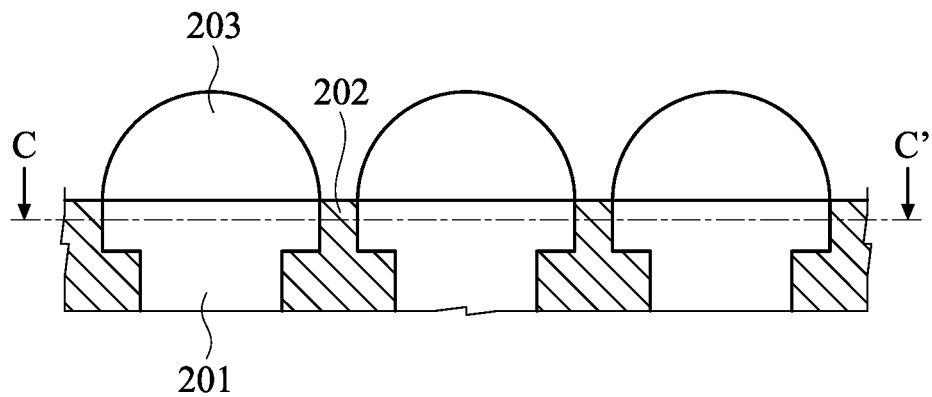
FIG. 5A is an enlarged side view in partial section of a part of a third embodiment in accordance with the present invention.
Figure 5B:
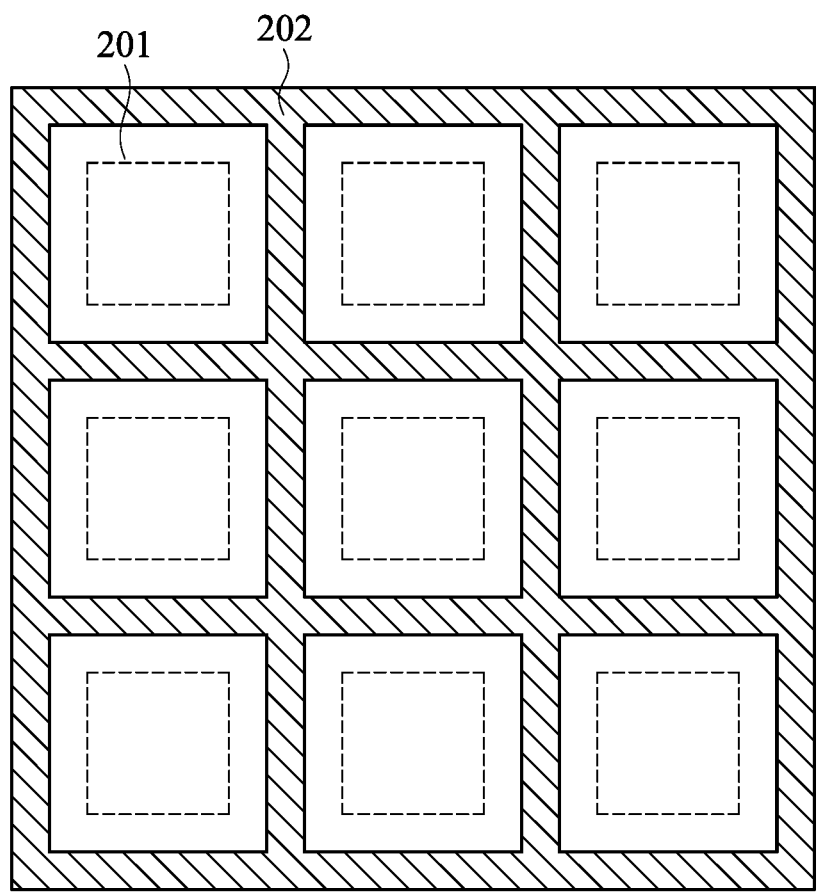
FIG. 5B is a cross sectional view along with C-C' line in FIG. 5A.

As shown in FIGS. 3A and 3B, the black matrix 202 of the color filter 20 is a crisscross net. In the present embodiment, the black matrix 202 further laterally extends to surround the filter units 201. In the present embodiment, a vertical section of a part of the black matrix 202 between the adjacent filter units 201 is a rectangle. Thus, a vertical section of the filter units 201 corresponding to the part of the black matrix 202 is also a rectangle. In another embodiment, as shown in FIGS. 4A and 4B, a vertical section of a part of the black matrix 202 between the adjacent filter units 201 is wide at the top and narrow at the bottom. Thus, a vertical section of the filter units 201 is narrow at the top and wide at the bottom corresponding to the part of the black matrix 202. In another embodiment, as shown in FIGS. 5A and 5B, a vertical section of a part of the black matrix 202 between the adjacent filter units 201 is narrow at the top and wide at the bottom. Thus, a vertical section of the filter units 201 is wide at the top and narrow at the bottom corresponding to the part of the black matrix 202.

The micro-condenser lenses 203 are arranged in a matrix and disposed on the color filter 20 to respectively correspond to the filter units 201. In the present embodiment, the micro-condenser lenses 203 are a micro convex lens. As shown in the FIGS. 3A, 4A and 5A, a diameter of each of the micro-condenser lenses 203 matches a width of an upper surface of the corresponding filter unit 201.

Figure 2:
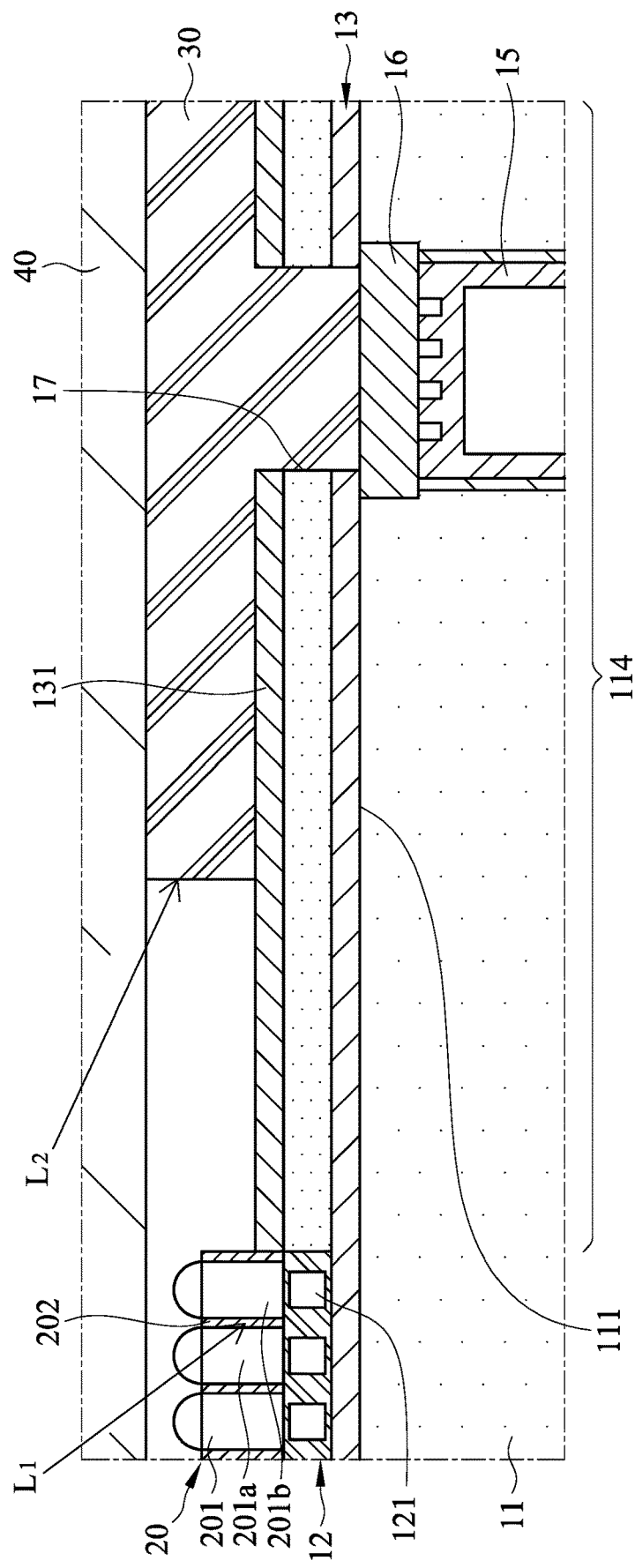
FIG. 2 is an enlarged view of a part of the A1 area in FIG. 1.

In one embodiment, the black adhesive layer 30 is disposed and partially covered on the first wiring layer 13 of the image sensor chip 10. The black adhesive layer 30 corresponds to the conductive vias 15 and the metal pads 16 of the chip body 11. In the present embodiment, as shown in FIG. 2, the black adhesive layer 30 is disposed on the passivation layer 131 and further filled in the holes 17 of the image sensor chip 10. Therefore, the holes 17 enhance the bonding reliability between the image sensor chip 10 and the glass cover 40, and prevent the glass cover 40 from detaching the image sensor chip 10. In the present embodiment, a material of the black adhesive layer 30 and a material of the black matrix 202 of the color filter 20 may be the same.

The glass cover 40 is mounted on the first surface 111 of the chip body 11 through the black adhesive layer 30, wherein a gap is kept between the glass cover 40 and the first surface 111 of the chip body 11.

Based on the foregoing description of the first embodiment of the image sensor package and FIG. 2, when an incident light L1 obliquely emits to the color filter 20 and passes through one of the filter units 201, which is a first filter unit 201a, the incident light L1 is absorbed by the black matrix 202 and does not enter another one of the filter units 201, which is a second filter unit 201b. Therefore, the black matrix 202 prevents the photosensitive unit 121 corresponding to the second filter unit 201b from sensing the incident light L1, and make sure no ghost image is created. Furthermore, due to the black matrix 202 surrounds the filter units 201, the black matrix 202 further blocks an incident light and a reflected light incident from a lateral side of the filter units 201. When an incident light L2 emits to the non-sensitive area 114 from the glass cover 40, the incident light L2 is directly absorbed by the black adhesive layer 30. Therefore, a reflected light is not generated by the black adhesive layer 30. The black adhesive layer 30 reduces the chance in forming flare of the photosensitive units 121. In conclusion, the black matrix 202 and the black adhesive layer 30 drastically reduce the light-sensing noise and enhance the image quality of the image sensor package.

Figure 6A:
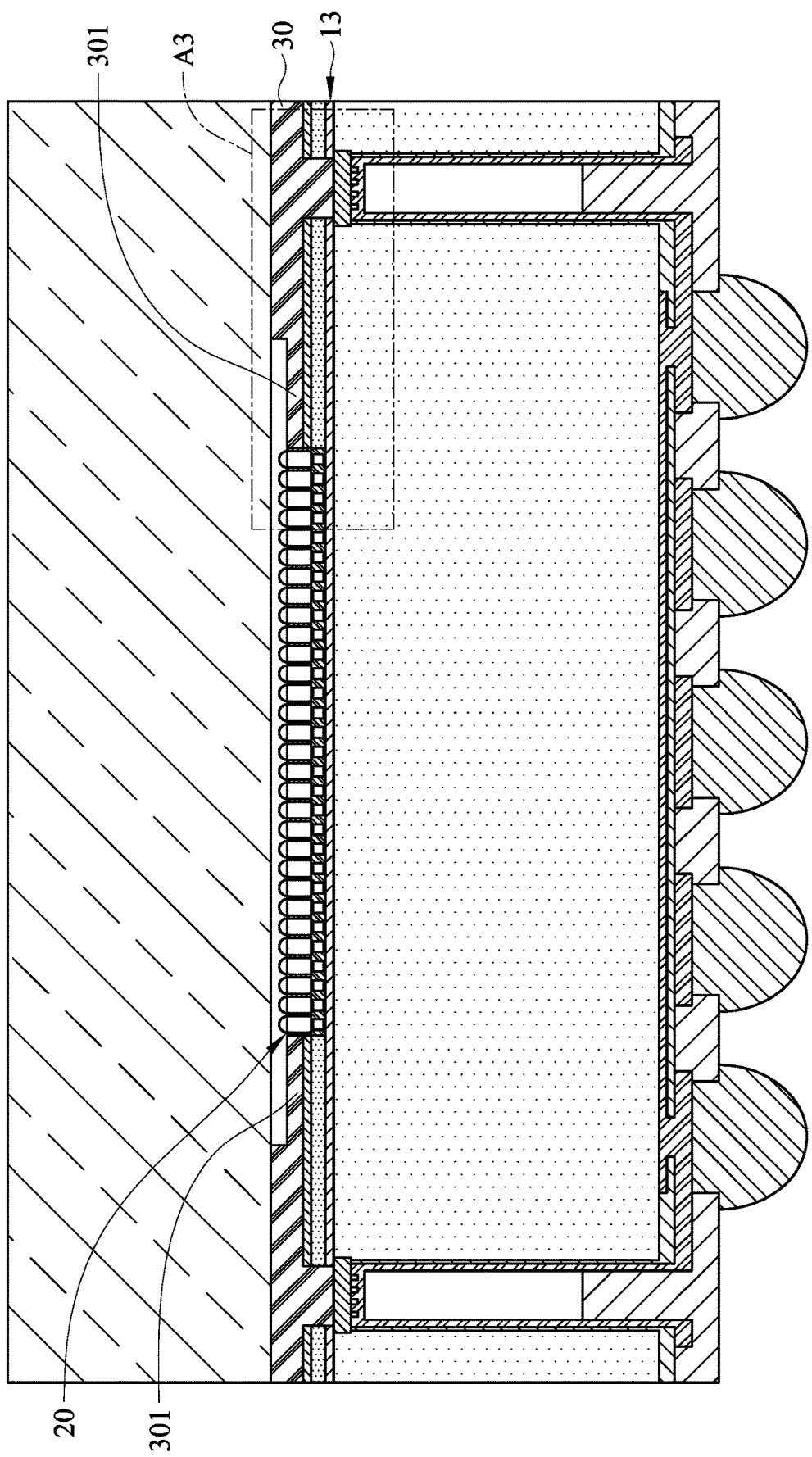
FIG. 6A is a side view in partial section of a fourth embodiment in accordance with the present invention.
Figure 6B:
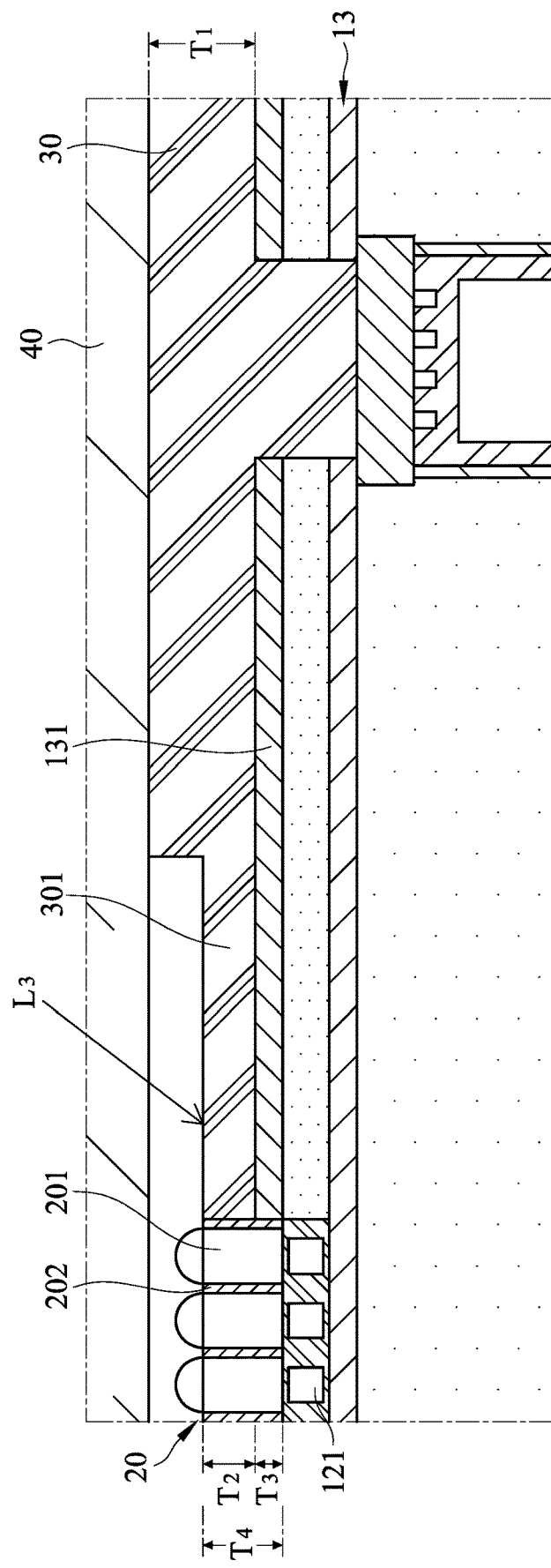
FIG. 6B is a partial enlargement view of A3 area in FIG. 6A.
Figure 7:
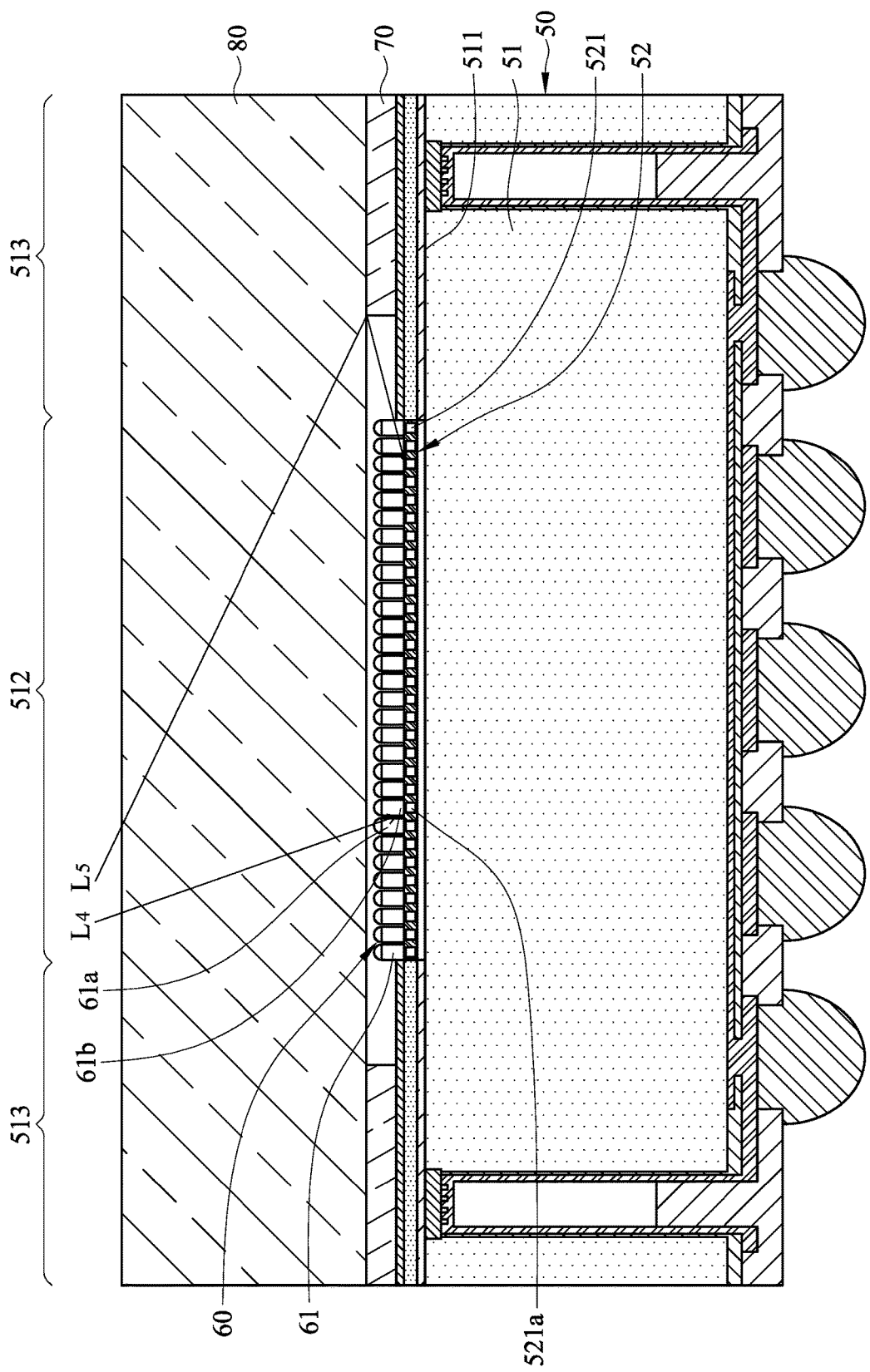
FIG. 7 is a side view in partial sectional in accordance with the prior arts.

With further reference to the FIGS. 6A and 6B, a fourth embodiment of an image sensor package is shown and similar to the image sensor package as shown in FIG. 1. In the fourth embodiment, the black adhesive layer 30 further extends to the color filter 20 to form a shading layer 301. The shading layer 301 completely covers on the first wiring layer 13 and surrounds the color filter 20. In one embodiment, a passivation layer 131 is further formed among the first wiring layer 13 and the black adhesive layer 30 and the shading layer 301 of the black adhesive layer 30. In the present embodiment, as shown in FIG. 6B, a thickness T2 of the shading layer 301 is smaller than a thickness T1 of the black adhesive layer 30. The sum of a thickness T2 of the shading layer 301 and a thickness T3 of the passivation layer 131 matches a thickness T4 of the filter units 201 of the color filter 20. In the present embodiment, a material of the black matrix 202, a material of the black adhesive layer 30 and a material of the shading layer 301 of the black adhesive layer 30 may be the same, but is not limited thereto. As shown in FIG. 6B, when an incident light L3 emits to the shading layer 301 from the glass cover 40, the incident light L3 is further absorbed by the shading layer 301. Therefore, the shading layer 301 prevents the photosensitive units 121 from the light-sensing noise.

With the foregoing description, due to the color filter having the filter units and the black matrix is disposed on the photosensitive area of the chip body, and the black adhesive layer is disposed on the first wiring layer in the non-sensitive area. When an incident light emits to the photosensitive area through the glass cover, the black matrix absorbs the incident light passes through the first filter unit, and travelling to the photosensitive unit corresponds to the second filter unit adjacent to the first filter unit. When another incident light emits to the non-sensitive area, the incident light is directly absorbed by the black adhesive layer without reflected light. Therefore, the black matrix and the black adhesive layer drastically reduce the light-sensing noise. Furthermore, the black adhesive layer further extends to the color filter to form the shading layer completely covering the first wiring layer. The black adhesive layer further reduces the light reflected by the first wiring layer when the incident light emits to the first wiring layer. Thus, the black matrix, the black adhesive layer, and the shading layer of the black adhesive layer make sure no ghost image is generated by the photosensitive units and reduce the chance in generating flare.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An image sensor package with low light-sensing noise, comprising:
   an image sensor chip having:
      a chip body having a first surface and a second surface, wherein the first surface has a photosensitive area and a non-sensitive area, and the non-sensitive area surrounds the photosensitive area;
      a photosensitive layer formed on the photosensitive area of the chip body and having a plurality of photosensitive units arranged in a matrix;
      a first wiring layer formed on the non-sensitive area of the chip body;
      a second wiring layer formed on the second surface of the chip body; and
      a plurality of conductive vias formed through the chip body to electrically connect to the first wiring layer on the first surface and the second wiring layer on the second surface;
   a color filter disposed on the photosensitive layer of the image sensor chip and having:
      a plurality of filter units arranged in a matrix; and
      a black matrix formed among the plurality of filter units, wherein the plurality of filter units respectively correspond to the plurality of photosensitive units of the photosensitive layer;
   a black adhesive layer disposed on and partially covering the first wiring layer on the non-sensitive area of the image sensor chip; and
   a glass cover adhered to the first surface of the chip body through the black adhesive layer, wherein a gap kept between the glass cover and the first surface of the chip body is defined by the black adhesive layer;
   wherein the black adhesive layer further extends to the color filter to form a shading layer;
   wherein a thickness of the shading layer is smaller than a thickness of the black adhesive layer.

2. The image sensor package as claimed in claim 1, wherein the shading layer completely covers the first wiring layer and surrounds the color filter.

3. The image sensor package as claimed in claim 2, wherein a material of the black matrix, a material of the black adhesive layer, and a material of the shading layer of the black adhesive layer are the same.

4. The image sensor package as claimed in claim 1, wherein the image sensor package further has:
   a plurality of metal pads formed on the non-sensitive area of the chip body and respectively and electrically connecting to the first wiring layer and the conductive vias;
   a plurality of holes corresponding to the metal pads and formed through the first wiring layer to expose each of the metal pads; and
   the black adhesive layer further filling in the holes.

5. The image sensor package as claimed in claim 2, wherein the image sensor package further has:
   a plurality of metal pads formed on the non-sensitive area of the chip body and respectively and electrically connecting to the first wiring layer and the conductive vias;
   a plurality of holes corresponding to the metal pads and formed through the first wiring layer to expose each of the metal pads; and the black adhesive layer further filling in the holes.

6. The image sensor package as claimed in claim 3, wherein the image sensor package further has:
- a plurality of metal pads formed on the non-sensitive area of the chip body and respectively and electrically connecting to the first wiring layer and the conductive vias;
- a plurality of holes corresponding to the metal pads and formed through the first wiring layer to expose each of the metal pads; and
- the black adhesive layer further filling in the holes.

7. The image sensor package as claimed in claim 4, wherein a vertical section of a part of the black matrix between the adjacent filter units is a rectangle.

8. The image sensor package as claimed in claim 5, wherein a vertical section of a part of the black matrix between the adjacent filter units is a rectangle.

9. The image sensor package as claimed in claim 6, wherein a vertical section of a part of the black matrix between the adjacent filter units is a rectangle.

10. The image sensor package as claimed in claim 4, wherein
- a vertical section of a part of the black matrix is wide at the top and narrow at the bottom, a vertical section of each of the plurality of filter units is narrow at the top and wide at the bottom corresponding to the part of the black matrix; or
- a vertical section of a part of the black matrix is narrow at the top and wide at the bottom, a vertical section of each of the plurality of filter units is wide at the top and narrow at the bottom corresponding to the part of the black matrix.

11. The image sensor package as claimed in claim 5, wherein
- a vertical section of a part of the black matrix is wide at the top and narrow at the bottom, a vertical section of each of the plurality of filter units is narrow at the top and wide at the bottom corresponding to the part of the black matrix; or
- a vertical section of a part of the black matrix is narrow at the top and wide at the bottom, a vertical section of each of the plurality of filter units is wide at the top and narrow at the bottom corresponding to the part of the black matrix.

12. The image sensor package as claimed in claim 6, wherein
- a vertical section of a part of the black matrix is wide at the top and narrow at the bottom, a vertical section of each of the plurality of filter units is narrow at the top and wide at the bottom corresponding to the part of the black matrix; or
- a vertical section of a part of the black matrix is narrow at the top and wide at the bottom, a vertical section of each of the plurality of filter units is wide at the top and narrow at the bottom corresponding to the part of the black matrix.

13. The image sensor package as claimed in claim 4, wherein
- the first wiring layer further has a dielectric layer with a low dielectric coefficient; and
- the color filter further has a plurality of micro-condenser lenses disposed on the color filter and arranged in a matrix to respectively correspond to the plurality of filter units.

14. The image sensor package as claimed in claim 5, wherein
- the first wiring layer further has a dielectric layer with a low dielectric coefficient; and
- the color filter further has a plurality of micro-condenser lenses disposed on the color filter and arranged in a matrix to respectively correspond to the plurality of filter units.

15. The image sensor package as claimed in claim 6, wherein
- the first wiring layer further has a dielectric layer with a low dielectric coefficient; and
- the color filter further has a plurality of micro-condenser lenses disposed on the color filter and arranged in a matrix to respectively correspond to the plurality of filter units.

16. The image sensor package as claimed in claim 2, wherein a passivation layer is formed among the first wiring layer and the black adhesive layer and the shading layer of the black adhesive layer.

17. The image sensor package as claimed in claim 3, wherein a passivation layer is formed among the first wiring layer and the black adhesive layer and the shading layer of the black adhesive layer.

18. The image sensor package as claimed in claim 16, wherein a sum of a thickness of the shading layer and a thickness of the passivation layer matches a thickness of the plurality of filter unit of the color filter.

19. The image sensor package as claimed in claim 17, wherein a sum of a thickness of the shading layer and a thickness of the passivation layer matches a thickness of the plurality of filter unit of the color filter.

20. The image sensor package as claimed in claim 18, wherein the image sensor chip further has:
- a solder mask formed on the second wiring layer and having a plurality of openings to exposing a part of the second wiring layer; and
- a plurality of solder balls respectively formed on the openings to electrically connect to the exposed part of the second wiring layer.

* * * * *